(12) United States Patent
Husth

(10) Patent No.: US 8,396,167 B2
(45) Date of Patent: Mar. 12, 2013

(54) DC COMPENSATION

(75) Inventor: Arne Birger Husth, Hellerup (DK)

(73) Assignee: Nokia Corporation, Espoo (FI)

( * ) Notice: Subject to any disclaimer, the term of this patent is extended or adjusted under 35 U.S.C. 154(b) by 245 days.

(21) Appl. No.: 12/919,758

(22) PCT Filed: Feb. 23, 2009

(86) PCT No.: PCT/EP2009/052095
§ 371 (c)(1),
(2), (4) Date: Aug. 26, 2010

(87) PCT Pub. No.: WO2009/106494
PCT Pub. Date: Sep. 3, 2009

(65) Prior Publication Data
US 2011/0013728 A1      Jan. 20, 2011

(30) Foreign Application Priority Data
Feb. 28, 2008 (GB) .................................. 0803710.3

(51) Int. Cl.
*H04L 25/06* (2006.01)
(52) U.S. Cl. ........ 375/317; 375/229; 375/230; 375/232; 375/233; 375/260; 375/316; 375/319; 375/324; 375/346; 375/348; 375/350; 370/210; 370/335; 370/342; 370/480; 455/63.1; 455/67.13; 455/114.2; 455/130; 455/296; 455/501; 327/307; 327/551; 708/300
(58) Field of Classification Search .................. 375/229, 375/230, 232, 233, 260, 316, 317, 319, 324, 375/346, 348, 350; 370/210, 335, 342, 344, 370/480; 455/63.1, 67.13, 114.2, 130, 296, 455/501; 327/307, 551; 708/300
See application file for complete search history.

(56) References Cited

U.S. PATENT DOCUMENTS

| | | | |
|---|---|---|---|
| 5,241,702 A | 8/1993 | Dent | |
| 5,402,433 A | 3/1995 | Stiscia | |
| 5,568,520 A | 10/1996 | Lindquist et al. | |
| 5,579,347 A | 11/1996 | Lindquist et al. | |
| 5,608,762 A | 3/1997 | Maddy | |
| 5,761,251 A | 6/1998 | Wender | |
| 5,835,538 A | 11/1998 | Townshend | |
| 5,838,735 A | 11/1998 | Khullar | |
| 5,852,630 A | 12/1998 | Langberg et al. | |
| 5,878,091 A | 3/1999 | Retzer | |
| 5,896,061 A | 4/1999 | Behrent | |

(Continued)

FOREIGN PATENT DOCUMENTS
CN    1943123        4/2007
EP    0895385 A      2/1999

(Continued)

OTHER PUBLICATIONS

International Search Report and Written Opinion Issued in Related Application PCT/EP2009/052095 mailed on Jun. 4, 2009, p. 1-15.

(Continued)

*Primary Examiner* — Leon Flores
(74) *Attorney, Agent, or Firm* — Squire Sanders (US) LLP

(57) ABSTRACT

An apparatus comprising an analog filter, an analog to digital converter coupled to said analog filter; and a digital filter coupled to said analog to digital converter; wherein the apparatus is configured such that distortion introduced into a filtered signal by said analog filter is substantially compensated by said digital filter.

16 Claims, 3 Drawing Sheets

U.S. PATENT DOCUMENTS

| | | | |
|---|---|---|---|
| 5,896,306 A | 4/1999 | Aschwanden | |
| 6,006,079 A | 12/1999 | Jaffee et al. | |
| 6,144,243 A | 11/2000 | Vaisanen | |
| 6,275,087 B1 | 8/2001 | Dehghan | |
| 6,370,205 B1 | 4/2002 | Lindoff et al. | |
| 6,516,183 B1 | 2/2003 | Hellmark | |
| 6,606,359 B1 | 8/2003 | Nag et al. | |
| 6,654,596 B1 | 11/2003 | Jakobsson et al. | |
| 7,426,245 B2 | 9/2008 | Husth | |
| 2003/0069911 A1 | 4/2003 | Piirainen | |
| 2006/0217069 A1 | 9/2006 | Chen | |
| 2007/0140381 A1 | 6/2007 | Seumitsu | |

FOREIGN PATENT DOCUMENTS

| | | |
|---|---|---|
| EP | 1077561 A2 | 2/2001 |
| EP | 1811672 A1 | 7/2007 |
| GB | 2267629 A | 12/1993 |
| JP | 2002141821 A | 5/2002 |
| KR | 20010028136 A | 4/2001 |
| WO | 9729552 A1 | 8/1997 |

OTHER PUBLICATIONS

European Patent Office Examination Report Issued in Related Application EP01306391.2-2415 mailed on Oct. 26, 2006, p. 1-6.

Korean Office Action, dated Sep. 26, 2012; Issued on corresponding Korean Patent Application No. 2010-7021491.

Chinese Office Action, dated Oct. 9, 2012; Issued on corresponding Application No. 200980106781.X.

Office Action dated Nov. 30, 2012 for corresponding Vietnamese Patent Application No. 1-2010-02117.

Office Action dated Nov. 29, 2012 for corresponding European Patent Application No. 09 714 857.1.

DC COMPENSATION

RELATED APPLICATION

This application was originally filed as PCT Application No. PCT/EP2009/052095 on Feb. 23, 2009 and claims priority to GB Application No. 0803710.3 filed on Feb. 28, 2008, which is incorporated herein by reference in its entirety.

FIELD OF THE INVENTION

The present invention relates generally to communication, and more specifically to DC compensation in RF receivers, and in particular but not exclusively to DC compensation in Orthogonal Frequency Division Modulation (OFDM) based systems.

BACKGROUND

In Orthogonal Frequency Division Modulation (OFDM) data is transmitted on multiple frequencies for the duration of a symbol time, T. A property of OFDM is that the individual carriers are spaced in frequency by 1/T, where T is the time duration of the data symbol. This property allows OFDM receivers to be made with ideal frequency selectivity between the individual carriers. In other words, the carriers in an OFDM waveform are spaced in such a manner that they effectively do not see each other at the receiver side, i.e. they are orthogonal to each other so that there is no cross-interference and hence no signal loss.

The benefits of OFDM are high spectral efficiency (throughput/MHz of channel bandwidth) and high resistance to multi-path interference and frequency-selective fading.

In order to retain the carrier orthogonality through multi-path transmission channels with a delay spread, the OFDM symbols are effectively transmitted for a little longer time than T. At the receiver side this excess time is not needed for detecting the OFDM symbol and can therefore be regarded as a Guard Period (GP). For a typical system T can be 67 μs ($\Delta f$=15 kHz) and the GP can be 0.5 μs.

It is often convenient to define an OFDM system with carrier symmetry around the centre frequency of the channel, i.e. relative to the channel centre there are sub-carriers carrying data symbols at $+/-N/2 \times \Delta f$, where N is the total number of sub-carriers and $\Delta f$ is the sub-carrier spacing. In this respect the 0 Hz carrier, or the DC carrier, is an exception because transmitter and receiver technology makes it difficult to avoid impairment on this carrier. For this reason the DC carrier is often sacrificed. From a spectral point of view, the DC carrier can be regarded as any other sub-carrier. The complex DC level, if constant in the duration of the symbol time, will not interfere with the other data symbols, i.e. the DC sub-carrier is orthogonal to the data carrying sub-carriers.

When designing an RF receiver for an OFDM system one choice may be a direct conversion receiver. In a direct conversion receiver, the RF signal is mixed directly to base band, i.e. the local oscillator frequency equals the channel frequency. The DC component, inherently generated in the RF mixers, will therefore be present at the DC sub-carrier and if the DC level is constant during the time duration of the symbol it will in principle be harmless to the detection of the data symbols in the other sub-carriers.

However, when small RF signals are received, the DC component relative to the wanted signal may be significant. In extreme cases the DC level might exceed the wanted signal level by an order of magnitude. As the dynamic range of the electronics, and in particular of the A/D converter, is limited it is therefore normally desirable to remove the DC component in the base band, before A/D conversion.

Unfortunately removing the DC component is not easily done without distorting the signal in such a way that it impacts the detection of the other sub-carrier symbols. This is because, for a number of reasons, the DC level typically changes during the time duration of a symbol. Changes in the DC level may be caused, for example, by strong external blockers in the receive band generating a signal in the DC sub-carrier. Also, the DC level typically changes when the gain is changed in the front-end and/or back-end of the receiver under the control of an Automatic Gain Control (AGC) system.

One method that can be used to remove the DC component is a narrow stop band filter (or high pass filter) centred at 0 Hz. The cut-off frequency of this filter may typically range from a small fraction of the sub-carrier spacing up to the sub-carrier spacing.

Using a High Pass Filter (HPF) with a very narrow cut-off frequency has the drawback that this filter has an impulse response much longer than the symbol time T. It will therefore introduce Inter Symbol Interference (ISI) that will degrade symbol detection. Also, the purpose of the filter, to the remove the DC, is not optimal as the settling time of the filter will be long and it therefore takes the duration of multiple OFDM symbols before the DC is reduced.

Using a HPF with a higher cut-off frequency, for example equal to n times the sub-carrier spacing has the drawback that it breaks the orthogonality of the sub-carriers to the DC carrier. The equalization based on the transmission channel estimate, as commonly used in the digital receiver, will not be able to remove the distortion caused by the HPF. Another view on this problem is that the DC level after the HPF will not be constant throughout the OFDM symbol time because of the HPF settling. When the DC is not constant, the power spectrum will spread to the other sub-carriers and distort the modulated symbols in these sub-carriers.

It is an aim of some embodiments of the present invention to address, or at least mitigate, some of these problems.

SUMMARY

According to a first aspect of the present invention, there is provided an apparatus comprising an analog filter, a analog to digital converter coupled to said analog filter, and a digital filter coupled to said analog to digital converter, wherein the apparatus is configured such that distortion introduced into a filtered signal by said analog filter is substantially compensated by said digital filter.

According to an embodiment of the present invention, a frequency response of one of the analog filter and the digital filter may be substantially an inverse of the other of said analog filter and said digital filter. The analog filter may comprise a high pass filter. The high pass filter may have a frequency response determined by the equation:

$$A(s) = \frac{s}{s + \frac{1}{\tau}}$$

where τ is a time constant associated with the analog filter.

The digital filter may comprise an infinite impulse response filter. The digital filter may have a frequency response determined by the equation:

$$D(z) = \frac{1 - a \cdot z^{-1}}{1 - z^{-1}}$$

where a is a filter coefficient. The filter coefficient may be determined by the equation:

$$a = e^{\frac{-1}{\tau \cdot fs}}$$

where fs is a sample frequency.

The digital filter may comprise a filter memory. Said filter memory is configured to be periodically reset. According to one embodiment, the filter memory may be configured to be reset during a guard period before a data symbol is received.

The apparatus may further comprise at least one of: a low pass filter coupled between said analog filter and said analog to digital converter, a base band amplifier coupled between said low pass filter and said analog to digital converter, a channel filter coupled between said analog to digital converter and said digital filter, or a mixer coupled to an input of the analog filter, wherein said mixer is configured to mix a received signal with a mixing frequency.

The apparatus may be further configured to receive a radio frequency signal. The radio frequency signal may comprise an orthogonal frequency division modulated signal.

According to a second aspect of the present invention there is provided a method comprising filtering an analog signal with a first filter, converting the filtered analog signal in an analog to digital converter, and filtering said samples with a second filter, wherein distortion introduced into said filtered analog signal by said first filter is substantially compensated by said second filter.

A frequency response of one of the first filter and the second filter is substantially an inverse of the other of said first and second filters. The first filter may comprise a high pass filter. The high pass filter may have a frequency response determined by the equation:

$$A(s) = \frac{s}{s + 1/\tau}$$

where $\tau$ is a time constant associated with the analog filter.

The second filter comprises an infinite impulse response filter. The second filter may have a frequency response determined by the equation:

$$D(z) = \frac{1 - a \cdot z^{-1}}{1 - z^{-1}}$$

where a is a filter coefficient. The filter coefficient may be determined by the equation:

$$a = e^{\frac{-1}{\tau \cdot fs}}$$

where fs is a sample frequency.

Preferably, the second filter may comprise a filter memory. The method may further comprise periodically resetting the filter memory. Resetting the filter memory may be timed to occur during a guard period before a data symbol is received.

The method may further comprise mixing a received signal with a mixing frequency to generate said analog signal. Preferably, the received signal may comprise a radio frequency signal.

BRIEF DESCRIPTION OF THE DRAWINGS

Embodiments of the present invention will now be described by way of example only with reference to the accompanying Figures, in which.

DESCRIPTION OF PREFERRED EMBODIMENTS

Embodiments of the present invention are described herein by way of particular examples and specifically with reference to preferred embodiments. It will be understood by one skilled in the art that the invention is not limited to the details of the specific embodiments given herein.

Some embodiments of the present invention provide a method for removing a DC component in an analog base band of a receiver, while minimizing the distortion associated with the removal of the DC components from the signal. According to one embodiment of the present invention, the DC is held constant throughout the OFDM symbol time. The DC component is only changed during the guard period between the OFDM symbols.

According to one embodiment, a first order analog high pass filter is used to filter the base band signal. The high pass filter (HPF) may be chosen to have a relatively high cut-off frequency, such that the HPF settles quickly, preferably within the time of one or two OFDM symbols. As discussed above, a HPF with a relatively high cut-off frequency will distort the signal such that it breaks the orthogonality of the sub-carriers to the DC carrier.

According to some embodiments of the present invention, the signal may be further filtered in the digital base band in a first order Infinite Impulse Response (IIR) filter. The IIR filter coefficients may be carefully chosen to match the distortion introduced by the IIR to the distortion caused by the HPF, so as to remove, or substantially remove, the distortion from the signal, and thereby restoring, or substantially restoring, the orthogonality of the sub-carriers to the DC carrier.

Figure 1:
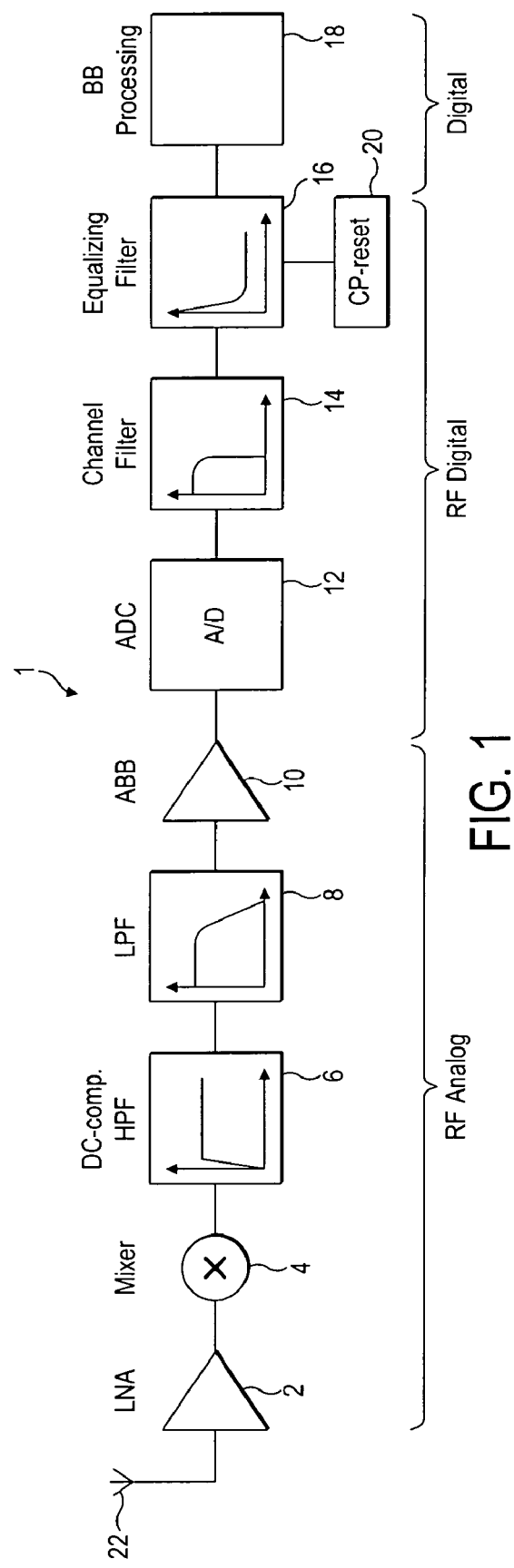
FIG. 1 illustrates a receiver in accordance with an embodiment of the present invention.

An embodiment of the present invention is illustrated in FIG. 1. FIG. 1 shows a receiver chain for use in receiving RF signals. Such a receiver chain could be implemented as part of, for example, a mobile terminal or a base station in a wireless network.

The diagram of FIG. 1 is a simplified block diagram of a receiver chain 1; commonly such a receiver chain would be used in a quadrature receiver, having two mixers and both an I (In-phase) branch and Q (Quadrature) branch after the mixers. For quadrature receivers the analog and digital filtering is performed separately in each of the two branches.

The receiver chain 1 of FIG. 1 may be split into three domains. In a radio frequency (RF) analog domain, an antenna 22 is coupled to an input of an amplifier 2, for example a low noise amplifier (LNA). An output of the amplifier 2 is coupled to a mixer 4, which also receives a mixing frequency (not shown). An output of mixer 4 is coupled to an input of a high pass filter (HPF) 6, the output of which is coupled to an input of a low pass filter (LPF) 8. The output of the LPF 8 is coupled to an input of a base band amplifier 10, and the output of the amplifier is coupled to an input of analog to digital converter 12.

An RF digital domain of the receiver chain of FIG. 1, digital samples are output by the ADC 12, and are coupled to an input of a channel filter 14. The channel filter 14 is coupled to Equalizing filter 16, which also receives a CP-Reset signal 20. The output of the Equalizing filter 16 is then coupled to base band processing 18, which is in a digital domain.

Considering the operation of the receiver chain 1, radio signals may be received by the antenna 22 and passed to the amplifier 2 for amplification. The amplified signals are then mixed with the mixing frequency in the mixer 4. Typically, the mixing frequency may be chosen such that the amplified received signals are downconverted to base band in the mixer 4. The downconverted signal is then high-pass filtered in HPF 6, thereby suppressing low frequency components, including any DC component, of the downconverted signal. The high-pass filtered component is then low-pass filtered in the LPF 8. This low-pass filtered signal is then amplified in base band amplifier 10. The gain of base band amplifier 10 may be set to ensure that the input of the ADC 12 uses the full range of the analog to digital converter, and therefore a good accuracy is achieved.

While embodiments of the invention have been described in the context of a received signal mixed to base band, embodiments of the invention may be equally applicable to receivers in which a signal is mixed to an intermediate frequency.

The digital samples output by the ADC 12, that represent the RF signal are then filtered in channel filter 14 to isolate the frequencies of interest. The filtered samples may then be filtered again in Infinite Impulse Response filter 16, before being passed to the base band processing 18 for decoding of the received signal.

In accordance with an embodiment of the present invention, the HPF 6 is a first order analog high-pass filter. The HPF removes DC components in the analog base band. A high cut-off frequency may be chosen relative the frequency spacing of the OFDM symbols, resulting in a HPF that settles quickly, within the time of one or two OFDM symbols. According to one embodiment of the present invention the cut-off frequency of the HPF may be chosen to be between a thirtieth of the frequency of the OFDM symbol spacing and one times the frequency of the OFDM symbol spacing.

In the digital base band, after analog to digital conversion, the equalizing filter 16, comprising a special first order 11R filter generally matched to the characteristics of the HPF 6, may remove the distortion introduced by the HPF 6.

In order for the Equalizing Filter 16 to remove the distortion introduced by the HPF 6, the Equalizing Filter may be designed in such a way that the combined frequency response of the HPF and the Equalizing filter has unity gain (i.e. a flat response) from DC to the band of interest, which may be determined by the sample rate in the digital filter.

According to one embodiment of the present invention, the filter may use a single delay element (or filter memory). The value of the sample in the memory will represent the instantaneous DC level in the digital filter input. The filter memory may be periodically forced to a certain value. According to one embodiment of the present invention, the filter memory may be forced to zero. In one embodiment, the filter memory may be reset during each guard period in the received signal.

Figure 2:
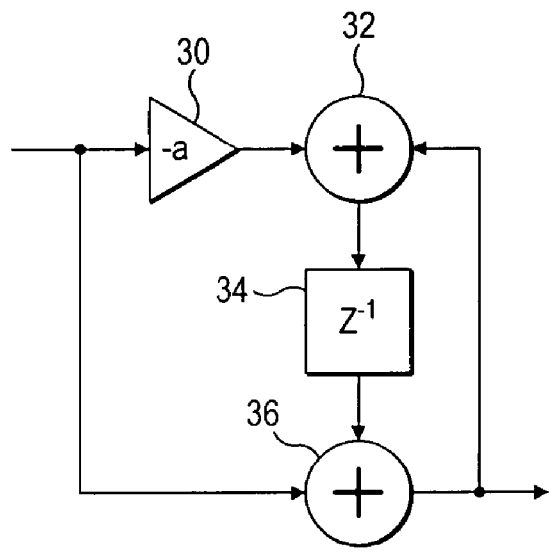
FIG. 2 illustrates an equalizing filter in accordance with an embodiment of the present invention.

An example embodiment of the Equalizing Filter 16 is shown in FIG. 2. The filter of FIG. 2 comprises amplifier 30, first adder 32, delay element 34, and second adder 36. The sample input to the Equalizing filter is applied to an input of amplifier 30, and to a first input of the second adder 36. The gain of the amplifier 30 may be equal to −a, where a is a filter coefficient. The amplified sample is coupled to a first input of first adder 32. An output of the first adder 32 is coupled to the delay element 34, and the output of the delay element 34 is coupled to a second input of the second adder 36. The second adder 36 adds the output of the delay element 34 to the input sample, and outputs the result. The output of the second adder 36 is coupled to a second input of the first adder 32 and is added to the amplified sample value to form the output of the first adder 32. The output of the second adder 36 also forms the output of the Equalization filter 16.

Only one of the two identical filters used to independently filter the I and Q branches of the receiver is shown.

In order to match the Equalizing filter to the characteristics of the HPF filter in the analog domain, such that the Equalizing filter is effectively an "inverse filter", a zero is introduced in the z-domain of the Equalizing filter that cancels the pole of the HPF in the s-domain. The harmful impact of the HPF may then be removed by applying the "inverse filter" in the digital domain. This filter will restore the DC in the digital domain to a constant level in-between analog gain updates, i.e. in-between DC jumps in the output of the RF mixer. Assuming that the high pass filter in the analog RF domain is a first order IIR filter of the form:

$$A(s) = \frac{s}{s + \frac{1}{\tau}}$$

where τ is the time constant of the HPF and s is the angular frequency. The 3 dB cut-off frequency is:

$$f_{3dB} = \frac{1}{2 \cdot \pi \cdot \tau}$$

Then the equalizing digital filter may take the form:

$$D(z) = \frac{1 - a \cdot z^{-1}}{1 - z^{-1}}$$

where the coefficient a can be derived from a direct matched z-transform of the zero which cancels the single pole in A(s):

$$a = e^{\frac{-1}{\tau \cdot f_s}}$$

fs is the sample frequency.

The filter coefficient "a" may depend on the sampling rate used in the digital domain. In a system that uses different sample rates for different modes, the "a" coefficient must be changed accordingly.

Whilst the constant DC level in the output of the filter is not harmful to the OFDM symbol decoding, it may be desirable to remove this DC level to improve the dynamic range of the filtered signal. The equalizing digital filter of FIG. 2 allows for an easy clearing of the filter memory, in order to remove the unnecessary DC level in the output of the filter. According to one embodiment of the invention, the filter memory may be cleared before every OFDM symbol, i.e. in the guard period (GP) before every OFDM symbol. Clearing the filter memory in this way may allow the unnecessary DC level to be removed while ensuring that the DC level is held constant during each symbol duration.

Figure 4:
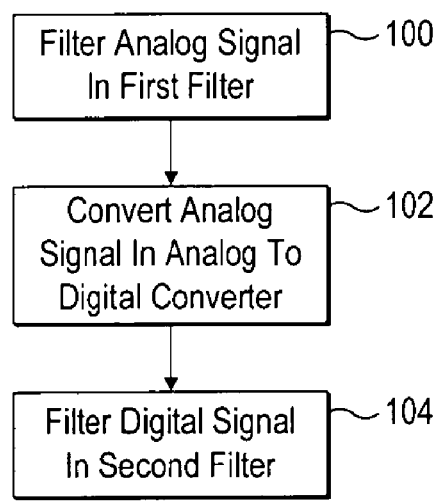
FIG. 4 illustrates a method according to one embodiment of the present invention.

FIG. 4 illustrates a method according to one embodiment of the present invention. In the method of FIG. 4, an analog signal is sampled in a first filter in step 100, introducing some distortion into the signal. The filtered signal is then converted in a digital to analog converter is step 102. In step 104, the digital signal is sampled in a second filter which compensates or substantially compensates for the distortion introduced in the first filter.

Figure 3:
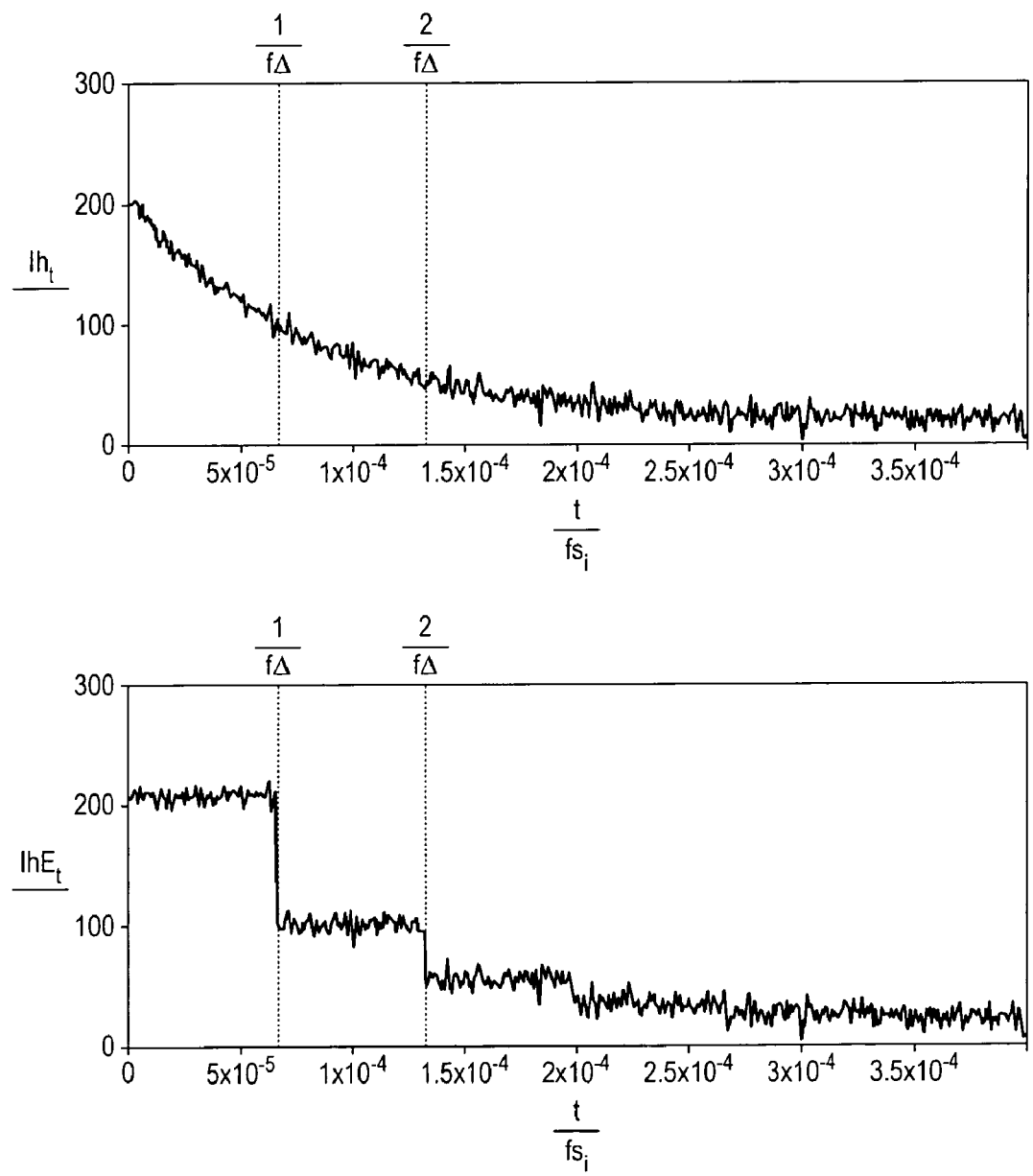
FIG. 3 shows simulated plots of the outputs of the high pass filter and the Equalizing filter according to one embodiment of the present invention.

The plots shown in FIG. 3 illustrate an example simulation of the operation of the equalizing filter 16 when an input with an extremely high DC component is applied. Only one of the branches I or Q is shown. The input signal to the Equalizing filter 14 is shown in the first plot. The plotted time window spans 6 OFDM symbols (with the first two OFDM symbols marked with vertical lines). The second plot shows the output of the digital filter when the filter memory is cleared before every new OFDM symbol. It can be seen that the DC in each OFDM symbol is approximately constant and decreases stepwise from one OFDM symbol to the next. Eventually it may approach zero, or converge to the level of the residual DC in the branch (constant part).

The high pass filter cut-off frequency was set to 2 kHz in the simulation. When the equalizing digital filter is used the cut-off frequency of the HPF in the RF could be set to 5 kHz or even higher without compromising the recovery of data symbols. A high cut-off value may lead to a fast settling filter, and therefore the constant DC level in the signal will be almost totally removed in the equalizing filter after the first OFDM symbol.

Some embodiments of the present invention may have one or more of the following benefits:

The equalizing IIR filter may ensure that the group-delay distortion and frequency distortion introduced by the HP-filter in the analog RF is neutralized, thereby eliminating the degradation in detection performance for the OFDM symbols close to the DC carrier.

The impact from any DC power generated in the RF, for example from strong blockers, may be reduced. A strong blocker appearing in the middle of an OFDM symbol may introduce a DC jump and degrade the detection of this symbol. However, the following symbols may be protected by the use of the equalizing filter. When the blocker disappears a similar DC jump will result that will only disturb a single OFDM symbol.

Embodiments of the invention have been discussed in the context of receiving OFDM symbols in an RF receiver. However, embodiments of the invention may be equally applicable to other wireless standards, and may be used in any situation where it is desired to reduce a DC power level in a signal applied to an analog to digital converter.

In general, the various embodiments of the invention may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. According to one embodiment of the present invention, the receiver may be implemented as part of an integrated circuit. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. An apparatus comprising: an analog filter; an analog to digital converter coupled to said analog filter; and a digital filter coupled to said analog to digital converter; wherein the apparatus is configured such that distortion introduced into a filtered signal by said analog filter is substantially compensated by said digital filter, wherein the apparatus is configured to reset a memory of the digital filter during a guard period of an orthogonal frequency division modulation (OFDM) symbol before a data symbol is received, the apparatus further comprising a low pass filter coupled between said analog filter and said analog to digital converter.

2. The apparatus of claim 1 wherein a frequency response of one of the analog filter and the digital filter is substantially an inverse of the other of said analog filter and said digital filter.

3. The apparatus of claim 1, wherein said analog filter has a frequency response determined by the equation:

$$A(s) = \frac{s}{s + \frac{1}{\tau}}$$

where $\tau$ is a time constant associated with the analog filter.

4. The apparatus of claim 1, wherein said digital filter has a frequency response determined by the equation:

$$D(z) = \frac{1 - a \cdot z^{-1}}{1 - z^{-1}}$$

where a is a filter coefficient.

5. The apparatus of claim 4, wherein said filter coefficient is determined by the equation:

$$a = e^{\frac{-1}{\tau \cdot fs}}$$

where fs is a sample frequency.

6. The apparatus of claim 1, wherein the apparatus is configured to periodically reset the memory.

7. The apparatus of claim 1, further comprising a base band amplifier coupled between said low pass filter and said analog to digital converter.

8. The apparatus of claim 1, further comprising a channel filter coupled between said analog to digital converter and said digital filter.

9. The apparatus of claim 1, further comprising a mixer coupled to an input of said analog filter, wherein said mixer is configured to mix a received signal with a mixing frequency.

10. A method comprising: filtering an analog signal with a first filter; converting the filtered analog signal in an analog to digital converter; and filtering saig-samples from the analog to digital converter with a second filter; wherein distortion introduced into said filtered analog signal by said first filter is substantially compensated by said second filter, wherein the method further comprises resetting a memory of the second filter during a guard period of an orthogonal frequency division modulation (OFDM) symbol before a data symbol is received; and low pass filtering said filtered analog signal prior to said converting.

11. The method of claim 10, wherein a frequency response of one of the first filter and the second filter is substantially an inverse of the other of said first and second filters.

12. The method of claim 10, wherein said first filter has a frequency response determined by the equation:

$$A(s) = \frac{s}{s + \frac{1}{\tau}}$$

where $\tau$ is a time constant associated with the analog filter.

13. The method of claim 10, wherein said second filter has a frequency response determined by the equation:

$$D(z) = \frac{1 - a \cdot z^{-1}}{1 - z^{-1}}$$

where a is a filter coefficient.

14. The method of claim 13, wherein said filter coefficient is determined by the equation:

$$a = e^{\frac{-1}{\tau \cdot fs}}$$

where fs is a sample frequency.

15. The method of claim 10, further comprising mixing a received signal with a mixing frequency to generate said analog signal.

16. A non-transitory computer-readable medium encoded with instructions that, when executed by a computer, perform: filtering an analog signal with a first filter; converting the filtered analog signal in an analog to digital converter; filtering samples from the analog to digital converter with a second filter; and resetting a memory of the second filter during a guard period of an orthogonal frequency division modulation (OFDM) symbol before a data symbol is received; and low pass filtering said filtered analog signal prior to said converting, wherein distortion introduced into said filtered analog signal by said first filter is substantially compensated by said second filter.

* * * * *